United States Patent
Inoue (10) Patent No.: US 6,562,524 B2
(45) Date of Patent: May 13, 2003

(54) PHOTOMASK AND METHOD OF FABRICATING THE SAME

(75) Inventor: Takashi Inoue, Tokyo (JP)

(73) Assignee: NEC Corporation, Tokyo (JP)

( * ) Notice: Subject to any disclaimer, the term of this patent is extended or adjusted under 35 U.S.C. 154(b) by 13 days.

(21) Appl. No.: 09/745,967

(22) Filed: Dec. 22, 2000

(65) Prior Publication Data

US 2001/0006753 A1 Jul. 5, 2001

(30) Foreign Application Priority Data

Dec. 24, 1999 (JP) .......................................... 11-368227

(51) Int. Cl.7 ................................................. G03F 9/00
(52) U.S. Cl. ......................................................... 430/5
(58) Field of Search ................................ 430/5, 22, 30; 359/354

(56) References Cited

U.S. PATENT DOCUMENTS 5,593,801 A * 1/1997 Yoshioka et al. .............. 430/5
5,786,113 A    7/1998 Hashimoto et al. ............ 430/5
6,150,059 A * 11/2000 Tanabe et al. ................. 430/5

FOREIGN PATENT DOCUMENTS

| JP | 2-236549 | 9/1990 |
| JP | 6-151290 | 5/1994 |
| JP | 6-266092 | 9/1994 |
| JP | 8-234410 | 9/1996 |
| KR | 186657   | 12/1998 |

* cited by examiner

Primary Examiner—S. Rosasco
(74) Attorney, Agent, or Firm—Scully, Scott, Murphy & Presser (57) ABSTRACT

A photomask includes (a) a photomask substrate (31), and (b) a light-impermeable film (32) formed on the photomask substrate (31), the light-impermeable film (32) being patterned into a pattern comprised of a first pattern (11) corresponding to a circuit pattern of a semiconductor integrated circuit, and a second pattern (14) formed around the first pattern (11) for adjusting a numerical aperture of the first pattern (11). For instance, the second pattern (14) is formed around the first pattern (11) in an area to which a light is not radiated, and has a numerical aperture almost equal to a numerical aperture of the first pattern (11).

12 Claims, 8 Drawing Sheets

PHOTOMASK AND METHOD OF FABRICATING THE SAME

BACKGROUND OF THE INVENTION

1. Field of the Invention

The invention relates to a photomask based on which a pattern is defined, used in photolithography.

2. Description of the Related Art

A photomask is grouped into an emulsion mask including a photographic dry plate having a high resolution and a hard mask including a glass substrate and a patterned light-impermeable or thin metal film formed on the glass substrate. Though the hard mask is expensive relative to the emulsion mask, the hard mask is superior to the emulsion mask with respect to an ability of accomplishing a small line and a mechanical strength. Hence, the hard mask is predominantly used as a photomask in fabrication of a semiconductor device.

Presently, photolithography in which a so-called reticle, a hard mask having a pattern about five times greater in dimension than an original pattern, is used for step and repeat exposure is predominantly used in fabrication of a semiconductor device with respect to an ability of mass-production and readiness in fabricating a mask.

A pattern in a reticle used in photolithography is fabricated almost by electron beam painting. Hereinbelow is explained a conventional reticle and a conventional method of fabricating a reticle, with reference to FIGS. 1A, 1B and 2A to 2E.

Figure 1A:
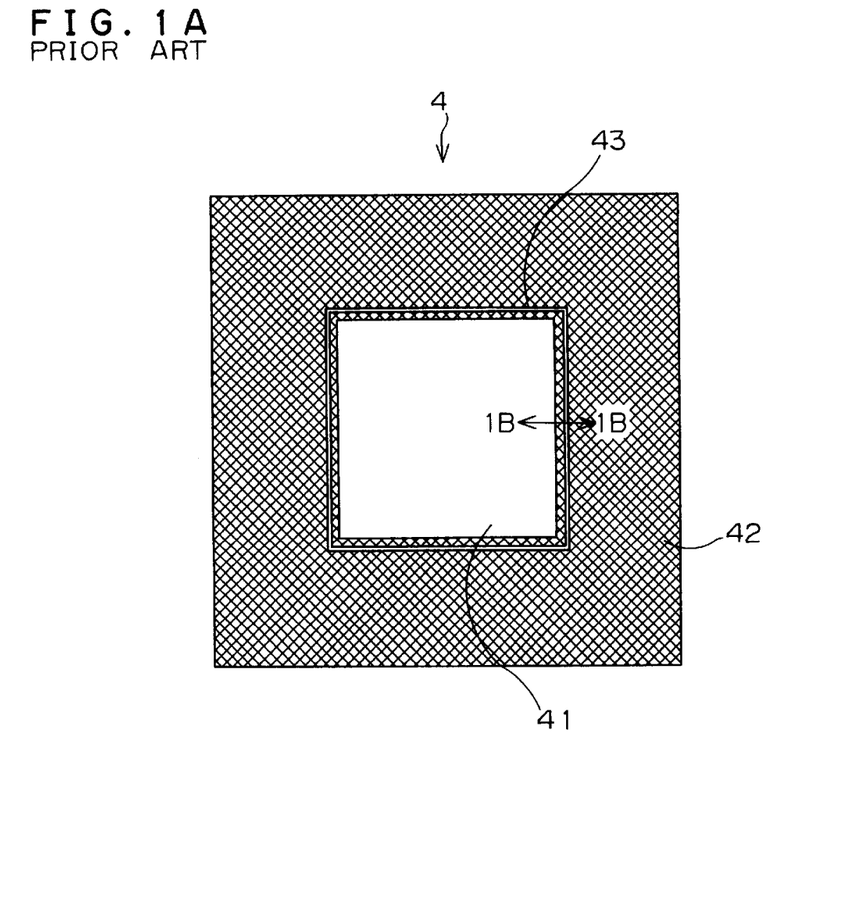
FIG. 1A is a plan view of a conventional reticle.
Figure 1B:
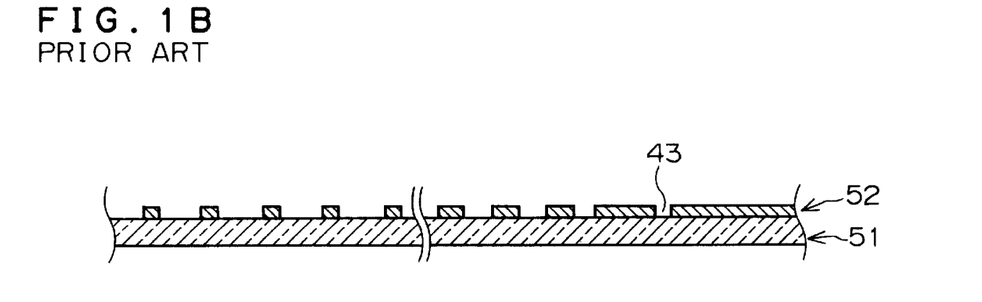
FIG. 1B is a cross-sectional view taken along the line 1B—1B in FIG. 1A.

FIG. 1A is a plan view of a conventional reticle 4, and FIG. 1B is a cross-sectional view taken along the line 1B—1B in FIG. 1A.

As illustrated in FIG. 1B, the conventional reticle 4 is comprised of a glass substrate 51 and a light-impermeable film 52 formed on the glass substrate 51. The light-impermeable film 52 has a pattern comprised of a chip pattern 41 and a frame pattern 42 formed around the chip pattern 41.

The chip pattern 41 is a mask pattern used for fabricating a gate electrode of a semiconductor chip and other parts, and is fabricated by forming openings in the light-impermeable film 52 in selected areas.

The glass substrate 51 is almost entirely covered with the light-impermeable film 52 in the frame pattern 42.

Around a periphery of the chip pattern 41 is formed an external frame line 43 as an opening of the light-impermeable film 52.

When a resist is to be exposed to a light through the reticle 4, at first, an object (not illustrated) to be etched, on which a resist has been coated, is mounted on an X-Y table equipped in an exposure unit (not illustrated), and the reticle 4 is mounted on a reticle stage (not illustrated) positioned above the X-Y table. After requisite alignment has been made, a light emitted from a light source is radiated to both the external frame line 43 and the chip pattern 41 through a condensing lens. The light having been radiated to the chip pattern 41 and the external frame line 43 passes through the reticle 4. The light having passed through the reticle 4 is condensed by another condensing lens, and then, projected onto the resist coated on the object to be etched.

Hereinbelow, a method of fabricating the reticle 4 is explained with reference to FIGS. 2A to 2E. FIGS. 2A to 2E are cross-sectional views of the reticle 4, taken along the line 1B—1B in FIG. 1A, illustrating respective steps of a method of fabricating the reticle 4.

Figure 2A:
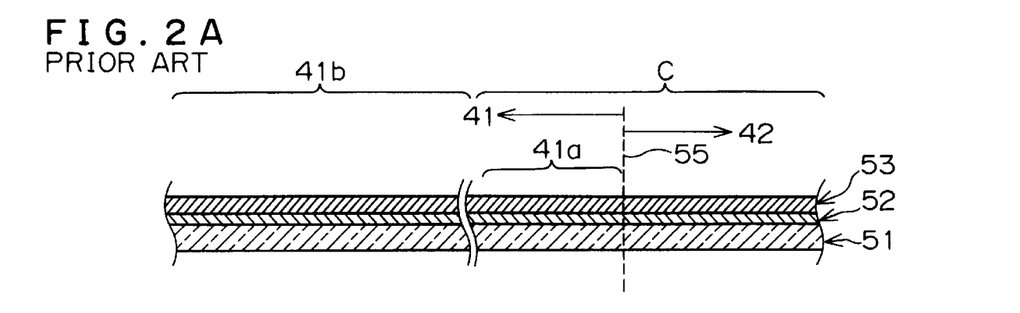
FIGS. 2A to 2E are cross-sectional views of the reticle illustrated in FIGS. 1A and 1B, taken along the line 1B—1B in FIG. 1A, illustrating respective steps of a method of fabricating the reticle.

In FIGS. 2A to 2E, a broken line 55 indicates a boundary between the chip pattern 41 and the frame pattern 42. An area located at the left of the boundary line 55 is the chip pattern 41, and an area located at the right of the boundary line 55 is the frame pattern 42. As illustrated in FIG. 2A, it is assumed that the chip pattern 41 is comprised of a peripheral portion 41a and a central portion 41b surrounded by the peripheral portion 41a. An area indicated with "C" indicates an area extending in the vicinity of the boundary line 55, including the peripheral portion 41a.

As illustrated in FIG. 2A, there is first prepared a blank comprised of a glass substrate 51 and a light-impermeable film 52 formed on the glass substrate 51 by sputtering. The glass substrate 51 is composed of soda-lime glass, heat resistance glass or synthesized quartz, for instance. The light-impermeable film 52 is comprised of a thin metal film such as a chromium film. The light-impermeable film 52 may be comprised of a silicide film such as a molybdenum silicon compound ($MoSi_2$) film.

Then, a positive resist 53 is applied onto the light-impermeable film 52, as illustrated in FIG. 2A.

Figure 2B:
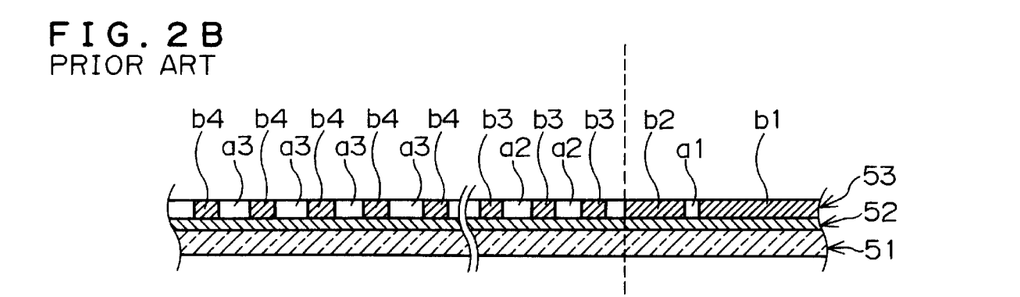

Then, electron beams are radiated to the positive resist 53 in predetermined areas thereof. As illustrated in FIG. 2B, the electron beams are radiated to the resist 53 in areas a1, a2 and a3, and the electron beams are not radiated to the resist 53 in areas b1, b2, b3 and b4.

In place of the electron beams, ion beams may be radiated to the resist 53.

Figure 2C:
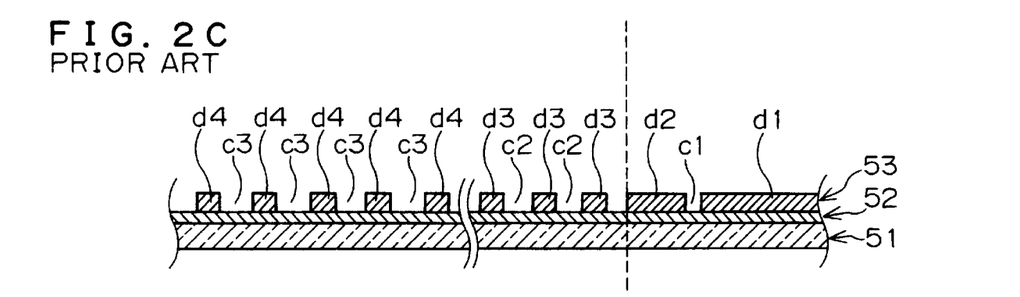

Then, the resist 53 having been exposed to the electron beams is soaked into a developing agent for developing the resist 53. By soaking the resist 53 into a developing agent, the areas a1, a2 and a3 are dissolved, and hence, removed. As a result, there are formed openings c1, c2 and c3, as illustrated in FIG. 2C.

The areas b1, b2, b3 and b4 are not dissolved, that is, remain as they are, and define resist patterns d1, d2, d3 and d4.

Then, the light-impermeable film 52 is dry-etched with the resist patterns d1, d2, d3 and d4 being used as a mask. As an etching gas, there is used a mixture gas containing $Cl_2$ at 75 volume % and $O_2$ at 25 volume %.

Figure 2D:
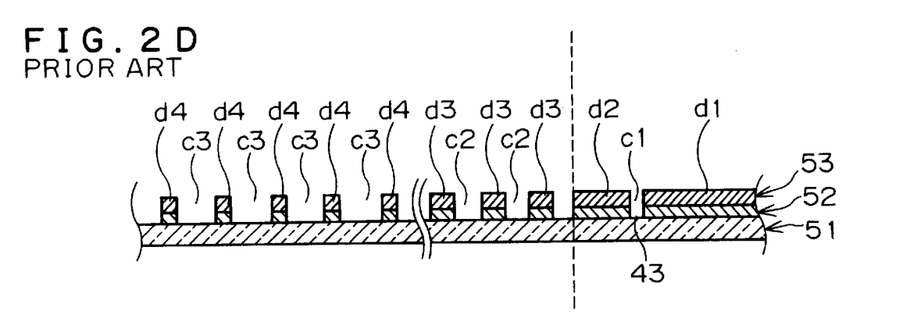

By carrying out dry etching, portions of the light-impermeable film 52 exposed through the openings c1, c2 and c3 are removed. A portion of the light-impermeable film 52 exposed through the opening c1 is removed to thereby define the external frame line 43, as illustrated in FIG. 2D. Portions of the light-impermeable film 52 exposed through the openings c2 and c3 are removed to thereby define the chip pattern 41, as illustrated in FIG. 2D.

Figure 2E:
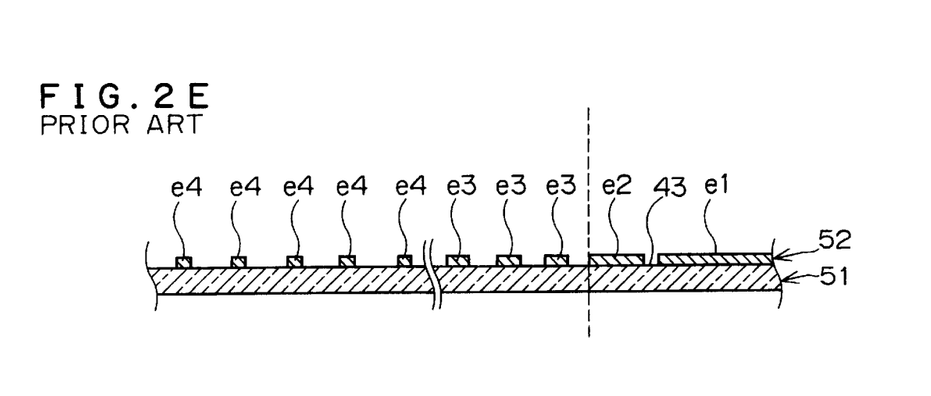

Then, the resist 53 is removed. By removing the resist 53, portions of the light-impermeable film 52 covered with the resist patterns d1, d2, d3 and d4 appear to define light-impermeable film patterns e1, e2, e3 and e4, as illustrated in FIG. 2E.

Thus, the reticle 4 is completed.

The above-mentioned conventional reticle 4 is accompanied with a problem that a numerical aperture in the central portion 41b of the chip pattern 41 is higher than a numerical aperture in the area C. In other words, a darkness rate in the central portion 41b is lower than a darkness rate in the area C. This is because the area C includes the peripheral portion 41a and the frame pattern 42 having almost no openings, whereas a circuit pattern is formed entirely in the central portion 41b, and hence, the central portion 41b has many openings.

For instance, a gate pattern of a logic circuit has a darkness rate of 30% or smaller, that is, a numerical aperture of 70% or greater, resulting in a remarkable difference in a numerical aperture between the area C and the central portion 41b of the chip pattern 41.

Such a difference in a numerical aperture between the area C and the central portion 41b causes unbalanced etching such as partially excessive etching or partial shortage in etching in accordance with a numerical aperture due to local loading effect.

If such unbalanced etching is caused not in a depth-wise direction of an object to be etched, but in a plane-wise direction of the same, etching rates would become different in portions of an object to be etched, in accordance with numerical apertures in a plane-wise direction of the object, even if a resist is exposed to a light in accordance with a properly designed pattern.

This results in a problem that an accurate mask pattern designed in accordance with a circuit pattern cannot be obtained. In other words, the above-mentioned difference in a numerical aperture causes reduction in an accuracy with which a resist is etched for forming a desired pattern. Even if a photomask having a reduced accuracy with which a resist is etched is used, since images made by such a photomask are projected onto a resist, it would be impossible to form a resist pattern with high accuracy in accordance with a circuit pattern.

In the above-mentioned conventional reticle 4, reduction in an accuracy in a pattern is caused as follows.

As a result of reaction between an etching gas and an object to be etched, composed of chromium (Cr), there is produced oxygen gas ($O_2$). The reaction formula is as follows.

$$2Cr_2O_3+4Cl \rightarrow 4CrCl+3O_2 \uparrow$$

The reaction defined with the reaction formula produces oxygen gas ($O_2$) in a relatively great amount in the central portion 41b having a relatively high numerical aperture, and oxygen gas ($O_2$) in a relatively small amount in the area C having a relatively small numerical aperture.

Oxygen gas ($O_2$) has a characteristic of etching the resist 53. Accordingly, oxygen gas ($O_2$) as the product resulted from the above-mentioned reaction etches, and hence, narrows the resist patterns d1, d2, d3 and d4. Due to a difference in generation of oxygen gas ($O_2$), the resist pattern 4d located in the central portion 41b of the chip pattern 41 is etched to a greater degree, and hence, becomes narrower than the resist pattern d3 located in the peripheral portion 41a.

A portion of the light-impermeable film 52 which appears as a result of etching the resist patterns d1, d2, d3 and d4 is removed by etching. Accordingly, a volume of the light-impermeable film 52 to be etched in more than an area of the resist openings at the start of etching is greater in the central portion 41b than in the peripheral portion 41a.

As a result, reduction in a width of the light-impermeable film pattern e4 located in the central portion 41b, relative to a designed width of the same, becomes greater than reduction in a width of the light-impermeable film pattern e3 located in the peripheral portion 41a, relative to a designed width of the same. This means that it is impossible to obtain a mask pattern in accordance with a circuit pattern.

Again, the conventional reticle 4 is accompanied with the problem that a difference in a numerical aperture between areas of the reticle 4 causes reduction in an accuracy with which a resist is etched for forming a pattern, as mentioned above.

SUMMARY OF THE INVENTION

In view of the above-mentioned problem in the conventional reticle, it is an object of the present invention to provide a photomask which is capable of eliminating unbalance in a numerical aperture between the peripheral portion and the central portion, thereby avoiding reduction in an accuracy with which a resist is etched for forming a pattern.

In one aspect of the present invention, there is provided a photomask including (a) a photomask substrate, and (b) a light-impermeable film formed on the photomask substrate, the light-impermeable film having a pattern comprised of a first pattern corresponding to a circuit pattern of a semiconductor integrated circuit, and a second pattern formed around the first pattern for adjusting a numerical aperture of the first pattern.

In accordance with the photomask, by adjusting a numerical aperture of the second pattern, it would be possible to increase a numerical aperture of the above-mentioned area C, and thereby equalize a numerical aperture of the area C to a numerical aperture of the above-mentioned central portion 41b. Hence, by balancing numerical apertures of the area C and the central portion 41b to such a degree that the chip pattern is adversely affected by local loading effect, it would be possible to avoid reduction in an accuracy with which a resist is etched for forming a pattern, and have a mask pattern or a resist pattern with high accuracy in accordance with a circuit pattern.

In a preferred embodiment, the second pattern is formed around the first pattern in an area to which a light is not radiated.

In the embodiment, a light is not radiated to the second pattern. Hence, it is possible to radiate a light only to the first pattern or chip pattern without radiating a light to the second pattern. As a result, the second pattern is not reflected to a pattern, ensuring that design data used for designing the second pattern optimal for increasing an accuracy in a chip pattern can be made without any bars.

In a preferred embodiment, the second pattern has a numerical aperture almost equal to a numerical aperture of the first pattern.

In accordance with the embodiment, it is possible to balance between numerical apertures in the area C and the central portion to such a degree that a chip pattern is not adversely affected by the local loading effect. Thus, it is possible to avoid reduction in an accuracy with which a resist is etched for forming a pattern, and have a mask pattern or a resist pattern with high accuracy in accordance with a circuit pattern.

In a preferred embodiment, the second pattern has a numerical aperture almost equal to an average of a numerical aperture in the entirety of the first pattern.

In accordance with the embodiment, it is possible to readily fabricate data for designing the second pattern which data is optimal for enhancing an accuracy of a chip pattern by using data of the chip pattern. It is also possible to balance between numerical apertures in the area C and the central portion to such a degree that a chip pattern is not adversely affected by local loading effect. Thus, it is possible to avoid reduction in an accuracy with which a resist is etched for forming a pattern, and have a mask pattern or a resist pattern with high accuracy in accordance with a circuit pattern.

In a preferred embodiment, the second pattern has a width equal to or greater than 10 mm.

The results of the experiments having been conducted by the inventor show that it is necessary for the second pattern to have a width equal to or greater than 10 mm in order to prevent the chip pattern from being adversely affected by local loading- effect. This is because the local loading effect could be found within 10 mm around the chip pattern in the conventional reticle 4. Accordingly, if the second pattern had a width smaller than 10 mm, it would be impossible to prevent reduction in an accuracy with which the chip pattern is formed.

In a preferred embodiment, the light-impermeable film has an almost uniform density in the second pattern.

In accordance with the embodiment, since the light-impermeable film has an almost uniform density in the second pattern, the second pattern does not cause unbalanced numerical aperture, and can properly adjust a numerical aperture of the first pattern. This ensures prevention of reduction in a pattern accuracy which reduction is caused by the local loading effect.

In a preferred embodiment, the light-impermeable film constituting the second pattern is equally spaced away from adjacent ones in both a first direction and a second direction perpendicular to the first direction.

In accordance with the embodiment, a pattern could be readily designed. In addition, the second pattern does not cause unbalanced numerical aperture, and can properly adjust a numerical aperture of the first pattern. This ensures prevention of reduction in a pattern accuracy which reduction is caused by the local loading effect.

It should be noted that a space between the adjacent light-impermeable films in the first direction is not always equal to a space between the adjacent light-impermeable films in the second direction.

In a preferred embodiment, the second pattern has a numerical aperture of 100%.

In accordance with the embodiment, since the light-impermeable film does not exist on the second pattern, it is no longer necessary to have the light-impermeable film have a uniform density on the second pattern. In addition, the second pattern does not cause unbalanced numerical aperture, and can properly adjust a numerical aperture of the first pattern. This ensures prevention of reduction in a pattern accuracy which reduction is caused by the local loading effect.

In a preferred embodiment, the first pattern has a numerical aperture equal to or greater than 70%.

If the chip pattern or first pattern has a numerical aperture equal to or greater than 70%, namely, has a darkness rate equal to or smaller than 30%, a difference in a numerical aperture between the area C and the central portion 41*b* becomes remarkable, resulting in reduction in a pattern accuracy which reduction is caused by the local loading effect. Hence, the first pattern is designed to have a numerical aperture equal to or greater than 70%.

In another aspect of the present invention, there is provided a method of fabricating a photomask, including the steps of (a) forming a light-impermeable film on a photomask substrate, (b) applying a resist onto the light-impermeable film, (c) exposing the resist to a light in a pattern comprised of a first pattern corresponding to a circuit pattern of a semiconductor integrated circuit, and a second pattern formed around the first pattern for adjusting a numerical aperture of the first pattern, (d) developing the resist to define a resist pattern, and (e) etching the light-impermeable film with the resist pattern being used as a mask.

In accordance with the method, by adjusting a numerical aperture of the second pattern, it would be impossible to increase a numerical aperture of the above-mentioned area C, and thereby equalize a numerical aperture of the area C to a numerical aperture of the above-mentioned central portion 41*b*. Hence, by balancing numerical apertures of the area C and the central portion 41*b* to such a degree that the chip pattern is not adversely affected by local loading effect, it would be possible to avoid reduction in an accuracy with which a resist is etched for forming a pattern, and have a mask pattern or a resist pattern with high accuracy in accordance with a circuit pattern.

In a preferred embodiment, the method further includes the steps of (f) fabricating at least two design data used for designing the second pattern, the design data having different data rates from one another, (g) calculating an average data rate of the first pattern, and (h) selecting design data which has a data rate closest to the average data rate, the resist being exposed to a light to define the second pattern, based on the data rate having been selected in the step (h).

In accordance with the embodiment, data for designing the second pattern is determined before determining data for designing the first pattern. Hence, a photomask could be rapidly designed. In addition, since data for designing the second pattern is determined for every data rate, and design data having a data rate closest to the average data rate is selected, it would be possible to effectively design the second pattern.

Herein, a data rate indicates a ratio of a light-impermeable pattern to the entirety of a photomask. A data rate is coincident with a darkness rate, and is contrary to a numerical aperture.

In a preferred embodiment, the method further includes the steps of (f) dividing an area in which the second pattern is to be formed, into grids, (g) fabricating at least two design data used for designing the second pattern, among first design data and second design data, the first design data designating grids equally spaced away from one another in both a first direction and a second direction perpendicular to the first direction, a pattern being formed in accordance with the first design data, the second design data having a data rate of 0%, (h) calculating an average data rate of the first pattern, and (i) selecting design data which has a data rate closest to the average data rate, the resist being exposed to a light to define the second pattern, based on the data rate having been selected in the step (i).

In accordance with the embodiment, data for designing the second pattern is determined before determining data for designing the first pattern. Hence, a photomask could be rapidly designed. In addition, since data for designing the second pattern is determined for every data rate, and design data having a data rate closest to the average data rate is selected, it would be possible to effectively design the second pattern.

Since an area in which the second pattern is to be formed is divided into grids, and a pattern is formed in accordance with the first design data, it would be possible to form the second pattern having a uniform data rate or numerical aperture. Furthermore, by varying spaces between the grids in the first and second directions, the second pattern having different data rates could be formed. Since the second pattern has a uniform data rate, the second pattern uniformly carried out its performance, ensuring that reduction in a pattern accuracy, caused by the local loading effect, can be uniformly prevented.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENT

A preferred embodiment in accordance with the present invention will be explained hereinbelow with reference to drawings.

Figure 3A:
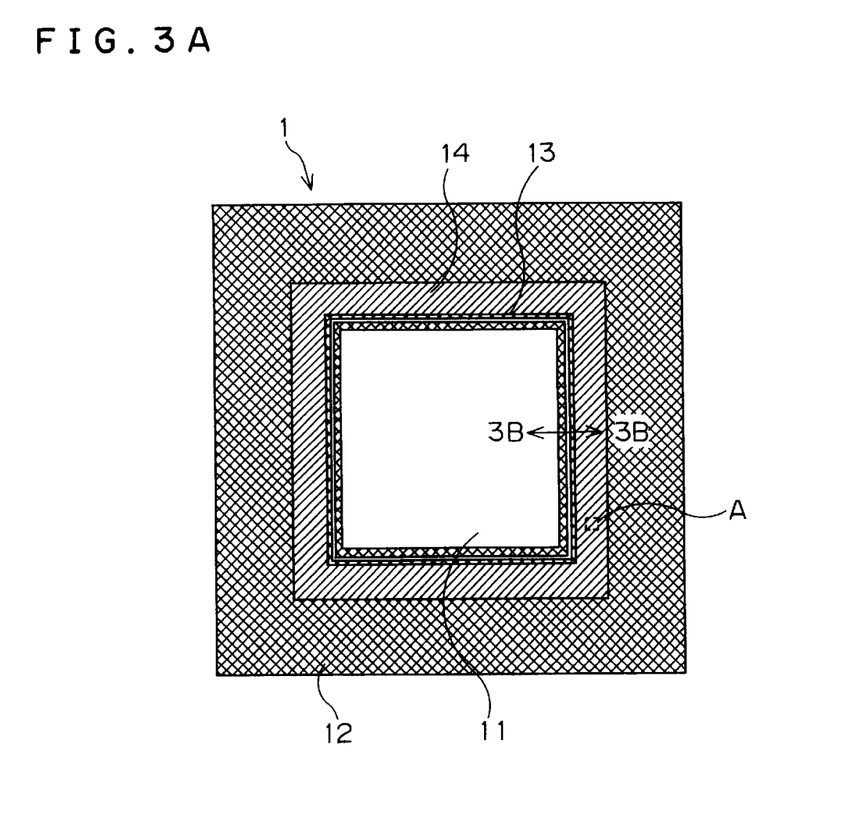
FIG. 3A is a plan view of a reticle in accordance with a preferred embodiment of the present invention.
Figure 3B:
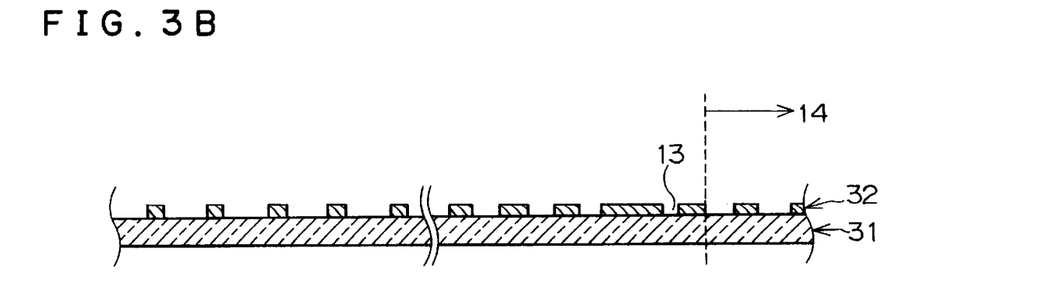
FIG. 3B is a cross-sectional view taken along the line 3B—3B in FIG. 3A.

FIGS. 3A and 3B illustrate a reticle 1 in accordance with the embodiment of the present invention.

As illustrated in FIG. 3B, the reticle 1 is comprised of a glass substrate 31 and a light-impermeable film 32 formed on the glass substrate 31. The light-impermeable film 32 has a pattern comprised of a chip pattern 11 and a frame pattern 12 formed around the chip pattern 11.

The chip pattern 11 is a mask pattern used for fabricating a gate electrode of a semiconductor chip and other parts, and is fabricated by forming openings in the light-impermeable film 32 in selected areas.

The chip pattern 11 defines an enlarged mask having a size of 80 mm×80 mm, for instance, and is projected onto a semiconductor wafer in a reduced size.

The glass substrate 31 is almost entirely covered with the light-impermeable film 32 in the frame pattern 12.

Around a periphery of the chip pattern 11 is formed an external frame line 13 as an opening of the light-impermeable film 32.

The reticle in accordance with the embodiment is designed to include an adjusting pattern 14 for adjusting a numerical aperture of the chip pattern 11. The adjusting pattern 14 is formed around the chip pattern 11 outside the external frame line 13, and is surrounded with the frame pattern 12. The adjusting pattern 14 is formed by making openings in the light-impermeable film 32 in selected areas. The adjusting pattern 14 is in the form of a frame.

The adjusting pattern 14 is designed to have a width slightly greater than 10 mm. If the width is smaller than 10 mm, it would be impossible to sufficiently prevent harmful influence caused by local loading effect which occurs in dry etching.

A distance between a peripheral edge of the chip pattern 11 and an inner edge of the adjusting pattern 14 is in the range of 1 to 2 mm.

Data for designing the adjusting pattern 14 is determined as follows.

First, there are made at least two data having different data rates or darkness rates from one another as data used for designing the adjusting pattern 14. In the embodiment, seven design data 21 to 27 having different data rates from one another are made, as illustrated in FIGS. 4A to 4G.

FIGS. 4A to 4G are enlarged views of an area indicated with "A" in FIG. 3A.

Figure 4A:
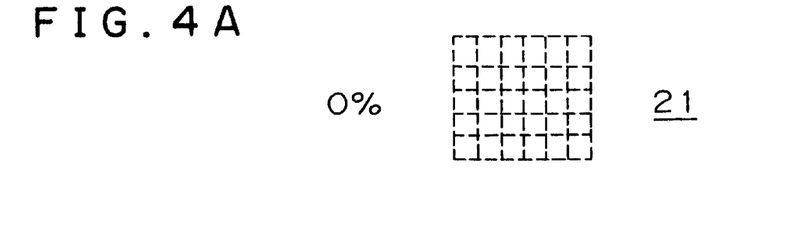
FIGS. 4A to 4G are enlarged views of an area indicated with "A" in FIG. 3A.

The first design data 21 illustrated in FIG. 4A is designed to have no areas in which a pattern is to be formed, and have all areas as an opening. Accordingly, the first design data 21 has a data rate or darkness rate of 0%, and a numerical aperture of 100%.

When the second to seventh design data 22 to 27 illustrated in FIGS. 4B to 4G are made, an area in which the adjusting pattern 14 is formed is divided into grids, and there is defined a rectangular block including a plurality of the grids. A grid located at a specific position in the block indicates an area in which a pattern is to be formed. In the embodiment, a grid located at an upper and left corner indicates an area in which a pattern is to be formed.

Figure 4B:
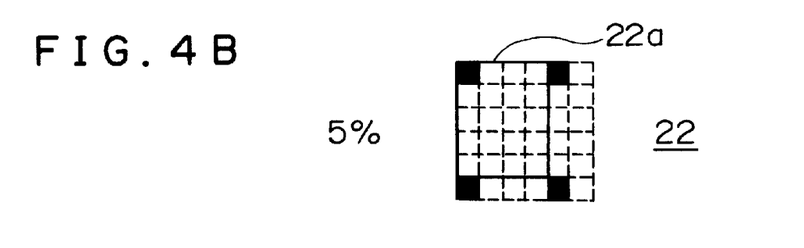

The second design data 22 illustrated in FIG. 4B is defined as a rectangle 22a including vertically 5 grids and horizontally 4 grids, totally 20 grids. A grid located at an upper and left corner indicates an area in which a pattern is to be formed. Accordingly, the second design data 22 has a data rate or darkness rate of 5% and a numerical aperture of 95%.

Figure 4C:
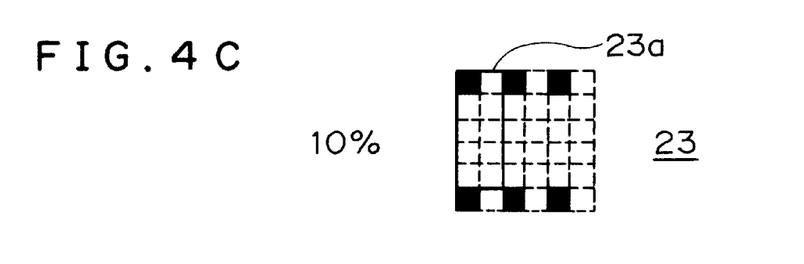

The third design data 23 illustrated in FIG. 4C is defined as a rectangle 23a including vertically 5 grids and horizontally 2 grids, totally 10 grids. A grid located at an upper and left corner indicates an area in which a pattern is to be formed. Accordingly, the third design data 23 has a data rate or darkness rate of 10% and a numerical aperture of 90%.

Figure 4D:
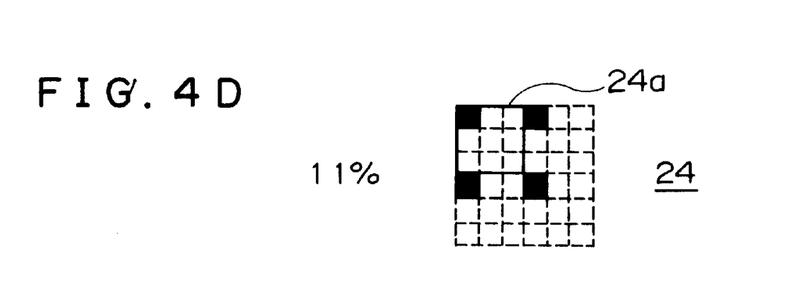

The fourth design data 24 illustrated in FIG. 4D is defined as a rectangle 24a including vertically 3 grids and horizontally 3 grids, totally 9 grids. A grid located at an upper and left corner indicates an area in which a pattern is to be formed. Accordingly, the third design data 24 has a data rate or darkness rate of 11% and a numerical aperture of 89%.

Figure 4E:
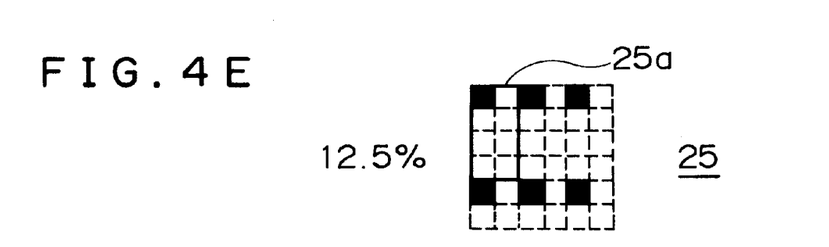

The fifth design data 25 illustrated in FIG. 4E is defined as a rectangle 25a including vertically 4 grids and horizontally 2 grids, totally 8 grids. A grid located at an upper and left corner indicates an area in which a pattern is to be formed. Accordingly, the third design data 25 has a data rate or darkness rate of 12.5% and a numerical aperture of 87.5%.

Figure 4F:
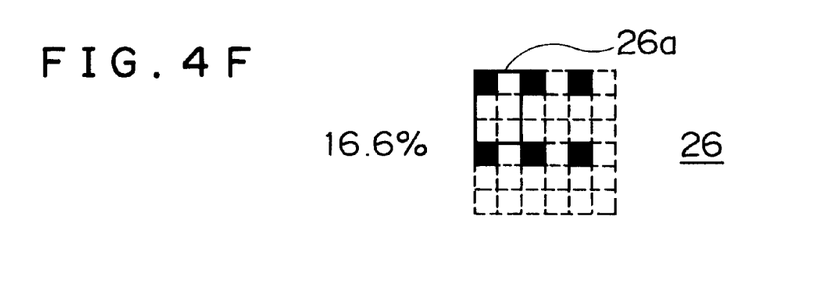

The sixth design data 26 illustrated in FIG. 4F is defined as a rectangle 26a including vertically 3 grids and horizontally 2 grids, totally 6 grids. A grid located at an upper and left corner indicates an area in which a pattern is to be formed. Accordingly, the third design data 26 has a data rate or darkness rate of 16.6% and a numerical aperture of 83.4%.

Figure 4G:
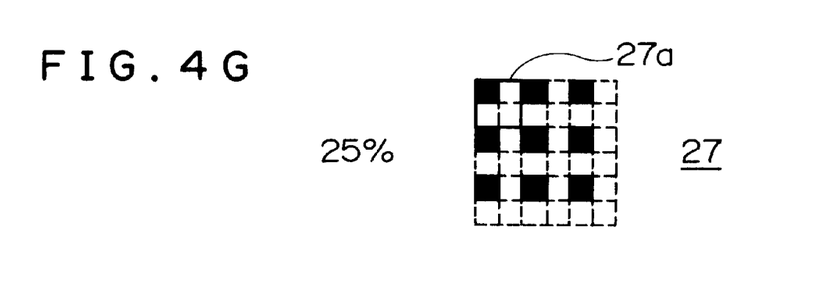

The sixth design data 27 illustrated in FIG. 4G is defined as a rectangle 27a including vertically 2 grids and horizontally 2 grids, totally 4 grids. A grid located at an upper and left corner indicates an area in which a pattern is to be formed. Accordingly, the third design data 27 has a data rate or darkness rate of 25% and a numerical aperture of 75%.

Then, an average data rate in the entirety of the chip pattern 11 is calculated. It is assumed in the embodiment that an average data rate is equal to 15%.

Then, there is selected design data having a data rate closest to the thus calculated average data rate of 15%. Since the sixth design data 26 has a data rate of 16.6% which is closest to the average data rate of 15%, the sixth design data 26 is selected.

The data for designing the adjusting pattern 14 is determined as mentioned above. If necessary, design data having different data rates from the data rates of the first to seventh design data 21 to 27 may be additionally used for designing the adjusting pattern 14.

When a resist is to be exposed to a light through the reticle 1, at first, an object (not illustrated) to be etched, on which a resist has been coated, is mounted on an X-Y table equipped in an exposure unit (not illustrated), and the reticle 1 is mounted on a reticle stage (not illustrated) positioned above the X-Y table. After requisite alignment has been made, a light emitted from a light source is radiated to both the external frame line 13 and the chip pattern 11 through a condensing lens. The light having been radiated to the chip pattern 11 and the external frame line 13 passes through the reticle 1. The light having passed through the reticle 1 is condensed by another condensing lens, and then, projected in a reduced size onto the resist coated on the object to be etched.

Since a light is not radiated onto the adjusting pattern 14, the adjusting pattern 14 is not projected to the resist coated on an object to be etched. Thus, the adjusting pattern 14 is not reflected to a pattern to be formed in the resist coated on an object to be etched.

Hereinbelow, a method of fabricating the reticle 1 is explained with reference to FIGS. 5A to 5E. FIGS. 5A to 5E are cross-sectional views of the reticle 1, taken along the line 3B—3B in FIG. 3A, illustrating respective steps of a method of fabricating the reticle 1.

Figure 5A:
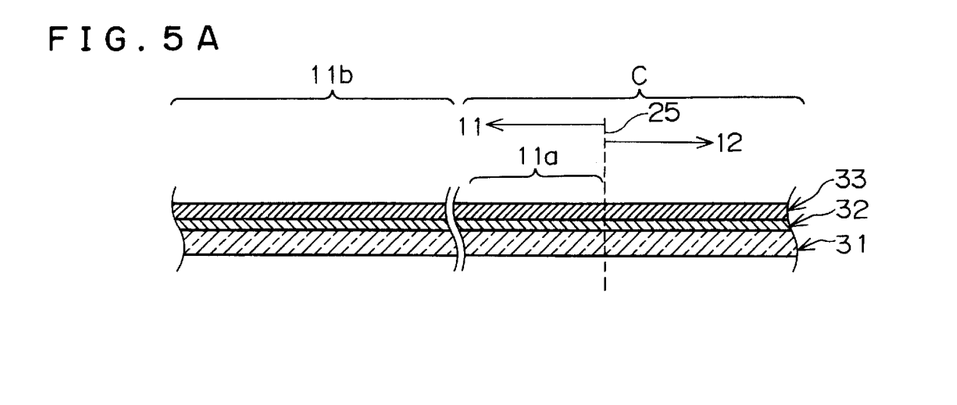
FIGS. 5A to 5E are cross-sectional views of the reticle illustrated in FIGS. 3A and 3B, taken along the line 3B—3B in FIG. 3A, illustrating respective steps of a method of fabricating the reticle.

In FIGS. 5A to 5E, a broken line 25 indicates a boundary between the chip pattern 11 and the frame pattern 12. An area located at the left of the boundary line 15 is the chip pattern 11, and an area located at the right of the boundary line 15 is the frame pattern 12. As illustrated in FIG. 5A, it is assumed that the chip pattern 11 is comprised of a peripheral portion 11a and a central portion 11b surrounded by the peripheral portion 11a. An area indicated with "C" indicates an area extending in the vicinity of the boundary line 15, including the peripheral portion 11a.

As illustrated in FIG. 5A, there is first prepared a blank comprised of a glass substrate 31 and a light-impermeable film 32 formed on the glass substrate 31 by sputtering. The glass substrate 31 is composed of soda-lime glass, heat resistance glass or synthesized quartz, for instance. The light-impermeable film 32 is comprised of a thin metal film such as a chromium film. The light-impermeable film 32 may be composed of silicide such as molybdenum silicon compound ($MoSi_2$).

Then, a positive resist 33 is applied onto the light-impermeable film 32, as illustrated in FIG. 5A.

Figure 5B:
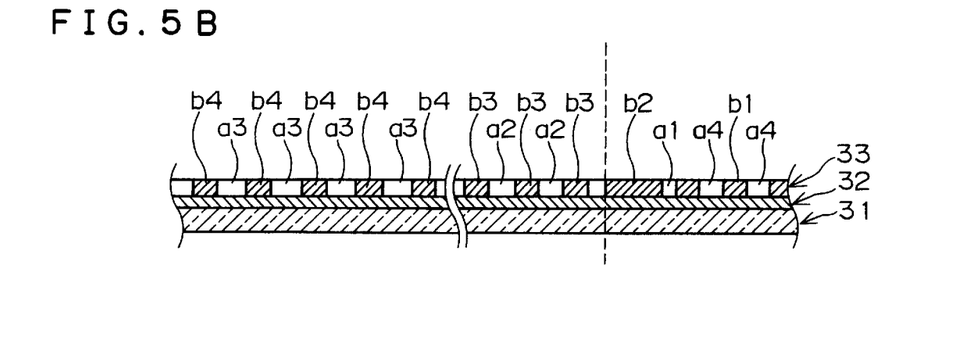

Then, electron beams are radiated to the positive resist 33 in predetermined areas. The adjusting pattern 14 is also exposed to the electron beams in accordance with the selected design data among the above-mentioned first to seventh design data 21 to 27. For instance, the adjusting pattern 14 is exposed to the electron beams in accordance with the sixth design data 26 having a data rate of 16.6%.

Since the resist 33 is of positive type, the electron beams are radiated to the resist 33 not in areas in which a pattern is to be formed, but in areas in which openings are to be formed.

As illustrated in FIG. 5B, the electron beams are radiated to the resist 33 in areas a1, a2, a3 and a4, and the electron beams are not radiated to the resist 33 in areas b1, b2, b3 and b4.

In place of the electron beams, ion beams may be radiated to the resist 33.

Figure 5C:
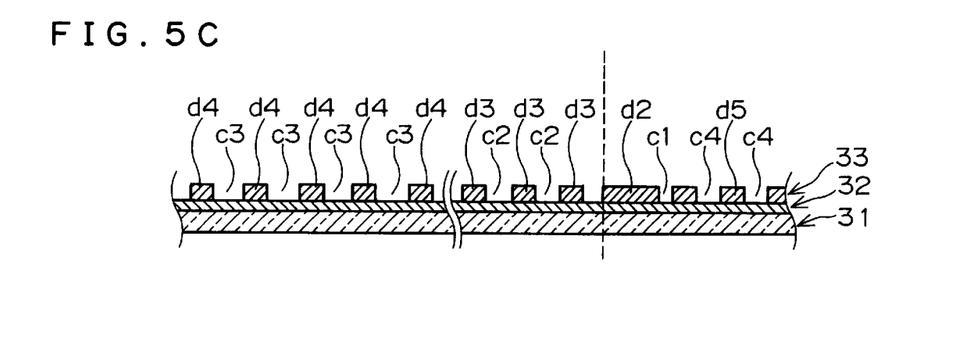

Then, the resist 33 having been exposed to the electron beams is soaked into a developing agent for developing the resist 33. By soaking the resist 33 into a developing agent, the areas a1 to a4 are dissolved, and hence, removed. As a result, there are formed openings c1, c2, c3 and c4, as illustrated in FIG. 5C.

The areas b1, b2, b3 and b4 are not dissolved, that is, remain as they are, and define resist patterns d2, d3, d4 and d5.

Then, the light-impermeable film 32 is dry-etched with the resist patterns d2, d3, d4 and d5 being used as a mask. As an etching gas, there is used a mixture gas containing $Cl_2$ at 75 volume % and $O_2$ at 25 volume %.

By carrying out the dry-etching, portions of the light-impermeable film 32 exposed through the openings c1, c2, c3 and c4 are removed.

In the step of dry-etching, as a result of reaction between the etching gas and the light-impermeable film 32 composed of chromium (Cr), there is produced oxygen gas ($O_2$). The reaction formula is as follows.

$$2Cr_2O_3 + 4Cl \rightarrow 4CrCl + 3O_2\uparrow$$

Since the reticle 1 is designed to include the adjusting pattern 14, a numerical aperture of the resist 33 in the area C is equal to a numerical aperture of the resist 33 in the central portion 11b. This means that a later defined a Cr exposure rate in the area C is equal to a Cr exposure rate in the central portion 11b. Herein, a Cr exposure rate is defined as a ratio (A/B) of an area (A) in which the light-impermeable film 32 is exposed, to a total area (B) of the light-impermeable film 32.

As a result, an amount of oxygen gas ($O_2$) generated in the area C is almost equal to an amount of oxygen gas ($O_2$) generated in the central portion 11b.

Oxygen gas ($O_2$) has a characteristic of etching the resist 33. Accordingly, oxygen gas ($O_2$) as the product resulted from the above-mentioned reaction etches, and hence, narrows the resist patterns d2, d3, d4 and d5.

As the resist patterns d2, d3, d4 and d5 have been etched, resultant exposed portions of the light-impermeable film 32 are also etched for removal.

An error of etching caused by oxygen gas ($O_2$), in a plane-wise direction of the light-impermeable film 32 is the same in all areas of the chip pattern 11. That is, a volume of the light-impermeable film 32 to be etched in more than an area of the resist openings at the start of etching, in the central portion 11b is equal to the same in the peripheral portion 11a.

As a result, reduction in a width of the light-impermeable film pattern e4 located in the central portion 11b, relative to a width of the resist pattern d4, is equal to reduction in a width of the light-impermeable film pattern e3 located in the peripheral portion 11a, relative to a width of the resist pattern d3. Accordingly, if a resist pattern is formed to have a slightly thicker width than a designed width, it would be possible to have a resist pattern and hence a mask pattern having a desired width.

With respect to the adjusting pattern 14, reduction in a width of the light-impermeable film pattern e5 relative to a width of the resist pattern d5 is not so great as the above-mentioned reduction in a width of the light-impermeable film pattern. However, this does not cause a problem, because the adjusting pattern 14 is not required to have a high pattern accuracy.

Figure 5D:
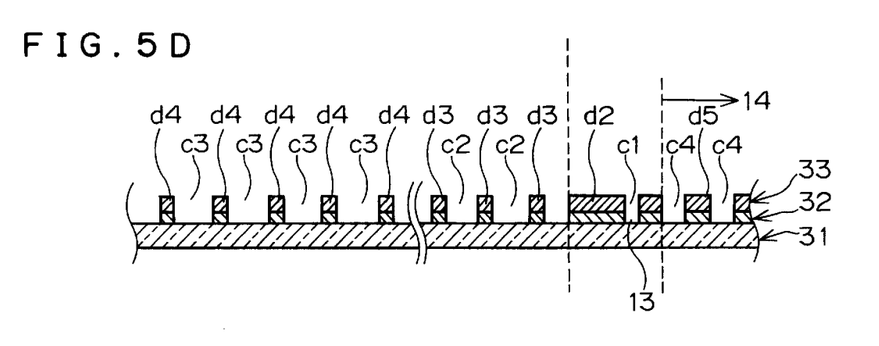
Figure 5E:
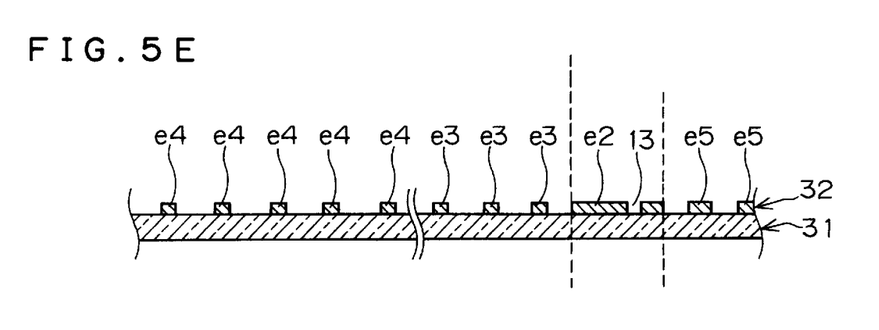

A portion of the light-impermeable film 32 exposed through the opening c1 is removed to thereby define the external frame line 13, as illustrated in FIG. 5D. Portions of the light-impermeable film 32 exposed through the openings c2 and c3 are removed to thereby define the chip pattern 11, as illustrated in FIG. 5D. A portion of the light-impermeable film 32 exposed through the opening c4 is removed to thereby define the adjusting pattern 14, as illustrated in FIG. 5D.

Then, the resist 33 is removed. By removing the resist 33, portions of the light-impermeable film 32 covered with the resist patterns d2 to d5 appear to define the light-impermeable film patterns e1, e2, e3, e4 and e5, as illustrated in FIG. 5E. The light-impermeable film pattern e5 defines the adjusting pattern 14.

Thus, the reticle 1 is completed.

In the reticle 1, a numerical aperture in the area C is equalized to a numerical aperture in the central portion 11b, ensuring no reduction in an accuracy of the chip pattern 11, which reduction was conventionally caused in the step of dry-etching the light-impermeable film 32 due to a difference in a numerical aperture between the area C and the central portion 11b. As a result, a resist pattern and hence a mask pattern in accordance with a circuit pattern can be obtained with a high accuracy.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-368227 filed on Dec. 24, 1999 including specification, claims, drawings and summary is incorporated herein by reference in its entirety.

What is claimed is:

1. A photomask comprising:
   (a) a photomask substrate; and
   (b) a light-impermeable film formed on said photomask substrate, said light-impermeable film having a pattern comprised of a first pattern corresponding to a circuit pattern of a semiconductor integrated circuit, and a second pattern formed around said first pattern for adjusting a numerical aperture of said first pattern.

2. The photomask as set forth in claim 1, wherein said second pattern is formed around said first pattern in an area to which a light is not radiated.

3. The photomask as set forth in claim 1, wherein said second pattern has a numerical aperture almost equal to a numerical aperture of said first pattern.

4. The photomask as set forth in claim 1, wherein said second pattern has a numerical aperture almost equal to an average of a numerical aperture in the entirety of said first pattern.

5. The photomask as set forth in claim 1, wherein said second pattern has a width equal to or greater than 10 mm.

6. The photomask as set forth in claim 1, wherein said light-impermeable film has an almost uniform density in said second pattern.

7. The photomask as set forth in claim 1, wherein said light-impermeable film constituting said second pattern is equally spaced away from adjacent ones in both a first direction and a second direction perpendicular to said first direction.

8. The photomask as set forth in claim 1, wherein said second pattern has a numerical aperture of 100%.

9. The photomask as set forth in claim 1, wherein said first pattern has a numerical aperture equal to or greater than 70%.

10. A method of fabricating a photomask, comprising the steps of:
    (a) forming a light-impermeable film on a photomask substrate;
    (b) applying a resist onto said light-impermeable film;
    (c) exposing said resist to a light in a pattern comprised of a first pattern corresponding to a circuit pattern of a semiconductor integrated circuit, and a second pattern formed around said first pattern for adjusting a numerical aperture of said first pattern;
    (d) developing said resist to define a resist pattern; and
    (e) etching said light-impermeable film with said resist pattern being used as a mask.

11. The method as set forth in claim 10, further comprising the steps of:
    (f) fabricating at least two design data used for designing said second pattern, said design data having different data rates from one another;
    (g) calculating an average data rate of said first pattern; and
    (h) selecting design data which has a data rate closest to said average data rate, said resist being exposed to a light to define said second pattern, based on the data rate having been selected in said step (h).

12. The method as set forth in claim 10, further comprising the steps of:
    (f) dividing an area in which said second pattern is to be formed, into grids;
    (g) fabricating at least two design data used for designing said second pattern, among first design data and second design data,
    said first design data designating grids equally spaced away from one another in both a first direction and a second direction perpendicular to said first direction, a pattern being formed in accordance with said first design data,
    said second design data having a data rate of 0%;
    (h) calculating an average data rate of said first pattern; and
    (i) selecting design data which has a data rate closest to said average data rate,
    said resist being exposed to a light to define said second pattern, based on the data rate having been selected in said step (i).

* * * * *